(12) United States Patent
Kai et al.

(10) Patent No.: US 7,196,370 B2
(45) Date of Patent: Mar. 27, 2007

(54) NONVOLATILE SEMICONDUCTOR MEMORY DEVICE HAVING TRENCH-TYPE ISOLATION REGION, AND METHOD OF FABRICATING THE SAME

(75) Inventors: Naoki Kai, Yokkaichi (JP); Hiroaki Hazama, Hachioji (JP); Hirohisa Iizuka, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 244 days.

(21) Appl. No.: 10/926,043

(22) Filed: Aug. 26, 2004

(65) Prior Publication Data

US 2005/0047261 A1 Mar. 3, 2005

(30) Foreign Application Priority Data

Aug. 28, 2003 (JP) ............................. 2003-304777

(51) Int. Cl.
*H01L 29/788* (2006.01)
*H01L 21/336* (2006.01)

(52) U.S. Cl. ...................... 257/315; 257/316; 257/317; 257/E21.682; 257/E27.103; 438/257; 438/259; 438/267; 438/682

(58) Field of Classification Search ........ 257/314–317, 257/E21.682, E27.103; 438/257–259, 266, 438/201

See application file for complete search history.

(56) References Cited

U.S. PATENT DOCUMENTS 5,698,879 A * 12/1997 Aritome et al. ............. 257/315
6,058,044 A * 5/2000 Sugiura et al. ......... 365/185.17
6,222,769 B1 * 4/2001 Maruyama et al. ..... 365/185.17
6,243,295 B1 * 6/2001 Satoh .................... 365/185.17
6,353,242 B1 * 3/2002 Watanabe et al. ........... 257/316
6,403,421 B1 * 6/2002 Ikeda et al. ................. 438/267
6,611,010 B2 * 8/2003 Goda et al. ................. 257/210
6,661,052 B2 * 12/2003 Matsui et al. ............... 257/316
6,720,610 B2    4/2004 Iguchi et al.
6,768,161 B2    7/2004 Kinoshita
6,853,029 B2 * 2/2005 Ichige et al. ................ 257/316
6,898,121 B2 * 5/2005 Chien et al. ........... 365/185.17

(Continued)

FOREIGN PATENT DOCUMENTS

JP        2002-57230        2/2002

(Continued)

OTHER PUBLICATIONS

U.S. Appl. No. 11/411,804, filed Apr. 27, 2006, Naka.

*Primary Examiner*—William Baumeister
*Assistant Examiner*—Igwe U. Anya
(74) *Attorney, Agent, or Firm*—Oblon, Spivak, McClelland, Maier & Neustadt, P.C.

(57) ABSTRACT

A nonvolatile semiconductor memory device includes a memory cell array region including a plurality of NAND cells, each NAND cell having a plurality of memory cell transistors, and which are arranged in series, and a plurality of select transistors. A trench-type isolation region is formed between columns in the array of the NAND columns. The trench-type isolation region is formed in self-alignment with end portions of the channel region and a floating gate of the memory cell transistor, formed in self-alignment with the end portion of a channel region of the select transistor, and has a recess formed in at least the upper surface between the floating gates of the memory cell transistors.

19 Claims, 10 Drawing Sheets

U.S. PATENT DOCUMENTS

| | | |
|---|---|---|
| 6,969,884 B2 | 11/2005 | Kitamura et al. |
| 7,067,871 B2 * | 6/2006 | Ozawa ....................... 257/315 |
| 2001/0028080 A1 * | 10/2001 | Himeno et al. ............. 257/315 |
| 2002/0195647 A1 * | 12/2002 | Aritome ..................... 257/315 |
| 2003/0057473 A1 * | 3/2003 | Kamiya et al. ............. 257/314 |
| 2004/0099900 A1 | 5/2004 | Iguchi et al. |
| 2005/0047261 A1 | 3/2005 | Kai et al. |

FOREIGN PATENT DOCUMENTS

| | | |
|---|---|---|
| JP | 2003-78047 | 3/2003 |
| JP | 2004-172488 | 6/2004 |

* cited by examiner

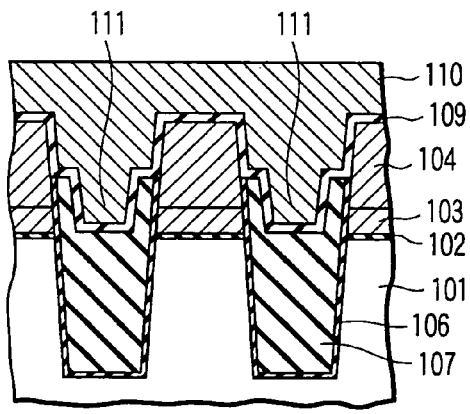
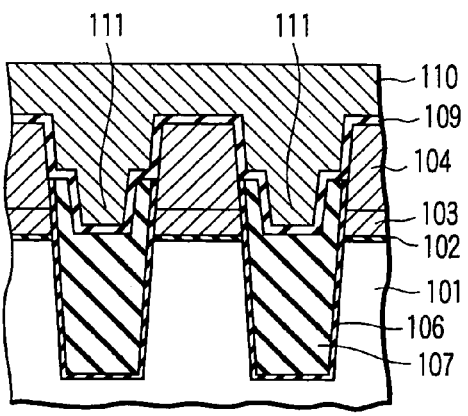
F I G. 4A
F I G. 4B
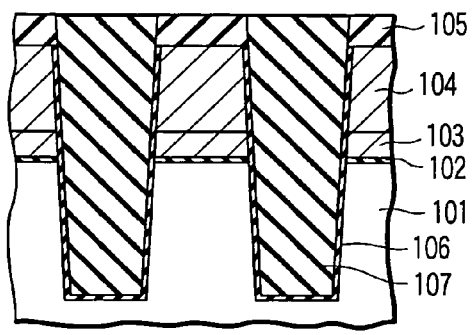
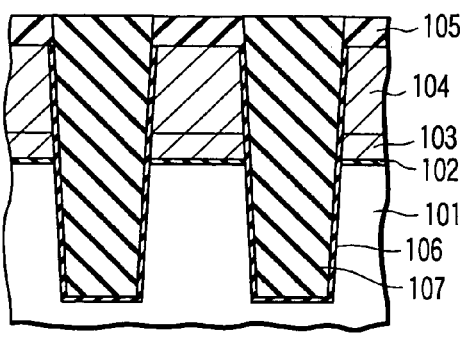
F I G. 5A
F I G. 5B
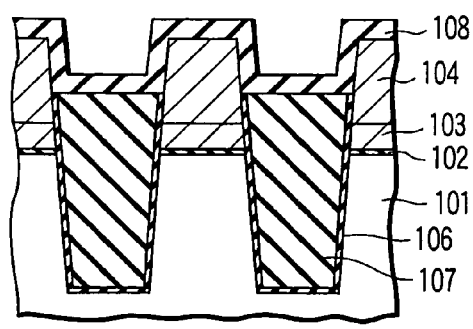
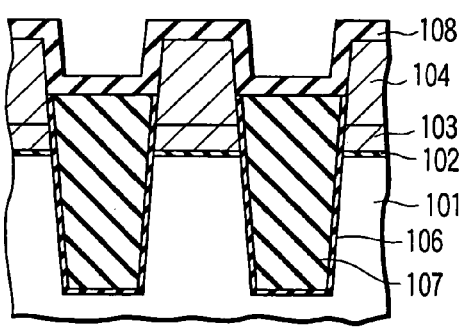
F I G. 6A
F I G. 6B

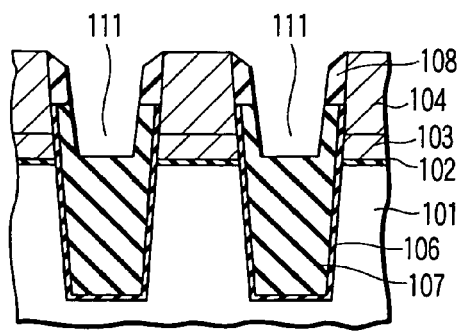 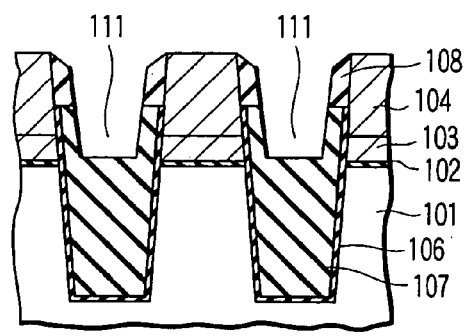
FIG. 7A    FIG. 7B
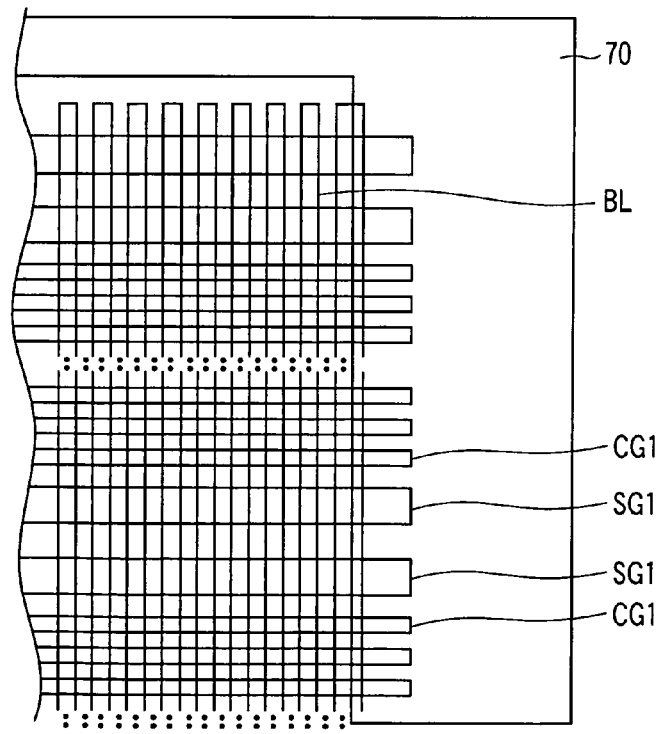
FIG. 8

NONVOLATILE SEMICONDUCTOR MEMORY DEVICE HAVING TRENCH-TYPE ISOLATION REGION, AND METHOD OF FABRICATING THE SAME

CROSS-REFERENCE TO RELATED APPLICATIONS

This application is based upon and claims the benefit of priority from prior Japanese Patent Application No. 2003-304777, filed Aug. 28, 2003, the entire contents of which are incorporated herein by reference.

BACKGROUND OF THE INVENTION

1. Field of the Invention

The present invention relates to a nonvolatile semiconductor memory device having a trench-type isolation region, and a method of fabricating the same. The present invention particularly relates to the structure of a trench-type isolation region of a nonvolatile semiconductor memory device in which a floating gate has a two-layered gate structure which is formed in self-alignment with the isolation region and an active region, and a method of forming the structure.

2. Description of the Related Art

A flash memory is well known as a nonvolatile semiconductor memory device in which data is electrically rewritten, and which is suited to increasing the density and capacity. In the flash memory, a plurality of cell transistors are arranged in the form of an array. Each cell transistor is a MOS transistor having a two-layered gate structure in which a floating gate and control gate are stacked. In a NAND flash memory, a plurality of cell transistors are connected in series.

FIG. 1 shows the sectional structure of a memory cell of a conventional NAND flash memory. Reference numeral 301 denotes a semiconductor substrate; 302, a first gate insulating film formed on the semiconductor substrate; 303 and 304, first and second polysilicon films, respectively, forming a floating gate of the memory cell; 306, a silicon oxide film; 307; an isolation region made of an insulating film; 309; a second gate insulating film; and 310, a third polysilicon film which functions as a control gate of the memory cell and a local source line.

In this flash memory shown in FIG. 1, in the direction in which the control gate runs, a coupling capacitance is present between the floating gates of two memory cells adjacent to each other via the isolation region 307. This capacitive coupling between adjacent cells may cause adverse effects.

Jpn. Pat. Appln. KOKAI Publication No. 2002-57230 has proposed a structure in which an isolation insulating film and a gate insulating film on the surface of a substrate are etched after floating gates are formed by etching, thereby decreasing the step of the isolation insulating film.

Also, Jpn. Pat. Appln. KOKAI Publication No. 2003-78047 describes a structure in which an isolation region is formed in self-alignment with an electrode layer made of one conductor layer, in order to decrease the size of a memory cell.

In the conventional NAND flash memories as described above, the coupling capacitance present between the floating gates of two memory cells adjacent to each other via the isolation region in the direction in which the control gate runs causes adverse effects between these cells.

BRIEF SUMMARY OF THE INVENTION

According to an aspect of the present invention, there is provided a nonvolatile semiconductor memory device comprising a memory cell array region including a plurality of NAND cells arranged in a matrix manner, each NAND cell having a plurality of memory cell transistors each of which has a stacked gate structure in which a floating gate and control gate are stacked on a semiconductor substrate, a source region, a drain region, and a channel region, and which are arranged in series to share the source and drain regions, a plurality of select transistors formed on the semiconductor substrate, the plurality of select transistors being arranged one at each of two ends of each NAND cell, having a source region, drain region, and channel region, and forming a NAND column together with the NAND cell by sharing the source region or drain region between two memory cell transistors at the two ends of the NAND cell, a trench-type isolation region formed between columns in an array of the NAND columns, formed in self-alignment with end portions of the channel region and floating gate of the memory cell transistor, formed in self-alignment with an end portion of the channel region of the select transistor, and having a recess formed in at least an upper surface between the floating gates of the memory cell transistors, a plurality of control gate lines each connected to the control gates of the memory cell transistors in the same row of the memory cell array region, and running in a row direction, a plurality of select gate lines connected to gates of the select transistors in the same row, and running in the row direction, a bit line connected, via a bit line contact, to the drain regions of the select transistors at opposing ends of two NAND columns adjacent to each other in a column direction in the array of the NAND columns, and a source line connected to the source regions of the select transistors at the other ends of the two NAND columns adjacent to each other in the column direction in the array of the NAND columns.

BRIEF DESCRIPTION OF THE SEVERAL VIEWS OF THE DRAWING

FIGS. 4A and 4B are sectional views of a NAND flash memory according to the first embodiment;

FIGS. 5A and 5B are sectional views in one fabrication step of the NAND flash memory according to the first embodiment;

FIGS. 6A and 6B are sectional views of a fabrication step following the step shown in FIGS. 5A and 5B;

FIGS. 7A and 7B are sectional views of a fabrication step following the step shown in FIGS. 6A and 6B;

FIG. 8 is a plan view showing an example of a photoresist pattern used in the step shown in FIGS. 7A and 7B;

DETAILED DESCRIPTION OF THE INVENTION

Figure 1:
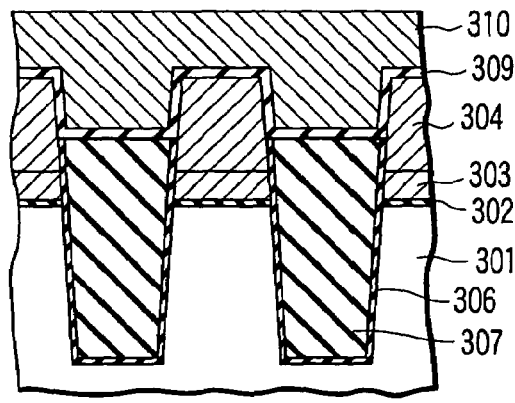
FIG. 1 is a sectional view of memory cells of a conventional NAND flash memory.
Figure 3:
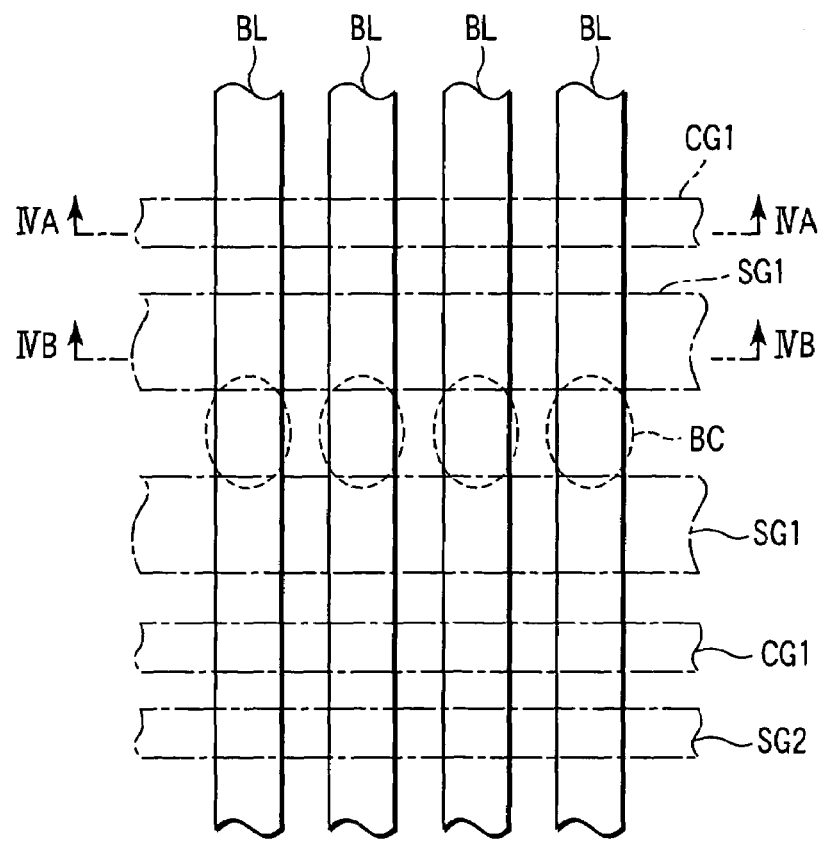
FIG. 3 is a plan view of memory cells of the NAND flash memory shown in FIG. 2.
Figure 2:
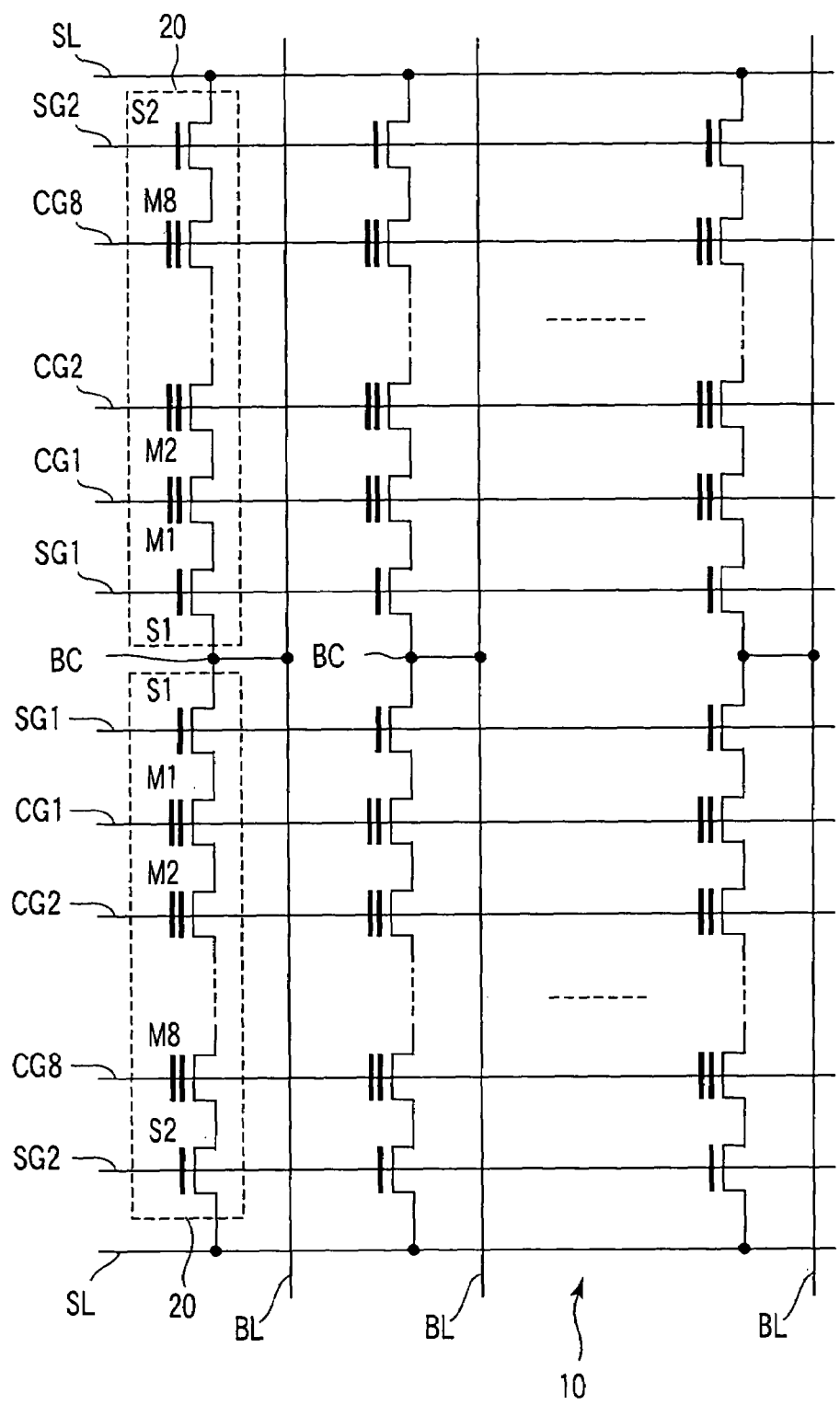
FIG. 2 is an equivalent circuit diagram of a NAND flash memory according to the present invention.

FIG. 2 is an equivalent circuit diagram showing a portion of a memory cell array of a NAND flash memory according to the present invention. FIG. 3 is a plan view showing the pattern layout of a portion of the memory cell array shown in FIG. 2.

Referring to FIG. 2, a memory cell array 10 has a plurality of NAND columns 20 arranged in a matrix manner. Each NAND column 20 has a NAND cell and select transistors S1 and S2. The NAND cell is made up of a plurality of, in this embodiment, eight memory cells M1 to M8 which are connected in series such that adjacent cells share a source and drain. The select transistors S1 and S2 are connected to the two ends of the NAND cell, i.e., one end on the drain side and the other end on the source side.

Each of the memory cells M1 to M8 is a MOSFET having a two-layered gate structure in which a floating gate is formed on a semiconductor substrate via a gate insulating film, and a control gate is formed on the floating gate via an insulating film. Each of the select transistors S1 and S2 is also a MOSFET.

The control gates of the memory cells M1 to M8 are connected to corresponding ones of control gate lines (word lines) CG1, CG2, ..., CG8 running in the row direction of the memory cell array. The gates of the select transistors S1 and S2 are connected to select gate lines SG1 and SG2, respectively, running in the row direction of the memory cell array.

On the substrate on which the elements are thus formed, a plurality of bit lines BL are formed via a CVD oxide film to run in the column direction. Each bit line BL contacts the drains of the select transistors S1 via a bit line contact BC. The source of each select transistor S2 is connected to a source line SL.

When a gate pre-formation process is used in the fabrication of the NAND flash memory described above, a gate oxide film is formed on the entire surface including a memory cell region and peripheral circuit region on the surface of a silicon substrate. After that, a polysilicon film as a floating gate of each memory cell is deposited, and a trench-type isolation region is formed in self-alignment with a pair of side surfaces of the polysilicon film.

Also, when stacked gates identical to those of the memory cells are used as the select transistors S1 and S2 in the peripheral circuit region, gate formation can be performed in the memory cell region and peripheral circuit region at the same time under the same etching conditions. This reduces the number of steps, and integrates the processes.

FIGS. 4A and 4B illustrate the sectional structures of a NAND flash memory according to the first embodiment. FIG. 4A shows an example of the sectional structure in the direction in which the control gates CG1 shown in FIG. 3 run. FIG. 4B shows an example of the sectional structure in the direction in which the select gates SG1 shown in FIG. 3 run.

Referring to FIGS. 4A and 4B, in a cell array region on a semiconductor substrate 101, a plurality of cell transistors M1 to M8 shown in FIG. 2 are arranged in series to form a NAND cell. Each cell transistor has a two-layered gate structure in which a floating gate made up of first and second polysilicon films 103 and 104 and a control gate 110 are stacked. As shown in FIG. 3, a plurality of NAND cells are formed in a matrix manner in this cell array region. The floating gate is formed on a channel region of the memory cell via a gate insulating film 102. The control gate 110 is formed on an inter-gate insulating film 109.

Select transistors, which are equivalent to S1 and S2 shown in FIG. 2 and arranged at the two ends of each NAND cell, each have a two-layered gate structure formed on a channel region via the gate insulating film 102 similar to that of the memory cell. The floating gate and the control gate 110 of each select transistor are electrically connected, so this select transistor functions as a MOS transistor.

A source region or drain region at one end of the select transistor is also used as a drain region or source region at one end of the memory cell at one end of the NAND cell. Likewise, a drain region and source region at the other end of the select transistor is also used as a drain region or source region at one end of the select transistor positioned at one end of another NAND cell adjacent to the former NAND cell in the cell column direction.

Element regions of adjacent cell columns, i.e., active regions made up of the source, drain, and channel regions of adjacent cell columns are insulated and isolated by trench-type isolation regions 107. Each trench-type isolation region 107 has a structure formed in self-alignment with the end portions of the active region and floating gate of the memory cell, and the end portions of the active region and lower gate of the select transistor. A recess 111 is formed in at least a portion of the upper surface of each isolation region 107 between the floating gates in the cell array region.

Control gate lines (word lines) equivalent to CG1, CG2, ..., shown in FIG. 3 are formed in the row direction so as to be connected to the control gates 110 of cell transistors in the same row of the cell array region. Also, select gate lines equivalent to SG1 and SG2 shown in FIG. 3 are formed in the row direction so as to be connected to the control gates 110 of select transistors in the same row of the select transistor formation region. Two select gate lines SG1, which correspond to select transistors S1 positioned at the opposing ends of two NAND cells adjacent to each other in the cell column direction, are adjacent to each other.

Note that a drain region shared by two select transistors S1 positioned at the opposing ends of two NAND cells adjacent to each other in the cell column direction is connected to a bit line BL via a bit line contact BC. Note also that a source region shared by two select transistors S2 positioned at the opposing ends of two NAND cells adjacent to each other in the cell column direction is connected to a source line SL.

In this NAND flash memory according to the first embodiment, a portion of the upper surface of the trench-type isolation region 107 between the floating gates of the memory cells is recessed. This reduces the coupling capacitance between the floating gates adjacent to each other in the longitudinal direction of the control gate 110 via the isolation region 107. As a consequence, adverse effects caused between cells by this coupling capacitance can be alleviated.

A method of fabricating the NAND flash memory having the sectional structure as shown in FIGS. 4A and 4B will be described below. In FIGS. 5A and 5B to 7A and 7B, each figure A corresponds to the section shown in FIG. 4A, and each figure B corresponds to the section shown in FIG. 4B.

First, as shown in FIGS. 5A and 5B, a first silicon oxide film 102 is formed on a semiconductor substrate 101. Subsequently, CVD is used to sequentially deposit a first polysilicon film 103, a second polysilicon film 104 to which phosphorus is added as an impurity, and a first silicon nitride film 105. A photoresist formed into a desired pattern by using lithography is used as a mask to process the first silicon nitride film 105, second polysilicon film 104, first polysilicon film 103, first silicon oxide film 102, and semiconductor substrate 101, thereby forming element regions.

Then, a second silicon oxide film 106 is formed on the side surfaces of each element region by thermal oxidation. After that, a buried insulating film 107 is deposited and planarized to the upper surface of the first silicon nitride film 105 by using CMP (Chemical Mechanical Polishing) or the like, thereby forming isolation regions 107. In this state, the upper surface of each isolation region 107 is higher than the substrate surface.

After the first silicon nitride film 105 is removed by hot phosphoric acid, the photoresist on a memory cell region is removed by lithography. As shown in FIGS. 6A and 6B, wet processing using buffered-HF and dry etching such as RIE (Reactive Ion Etching) are used to remove the buried insulating film in the isolation regions 107 to a desired height. More specifically, the upper portion of each isolation region 107 is removed until the upper surface of the isolation region 107 is intermediate between the upper surface of a floating gate (103 and 104) and the substrate surface. After that, an SiO₂ film 108 is deposited on the entire surface by CVD.

As shown in FIG. 8, lithography is performed to leave a photoresist 70 behind at the end portions of the memory cell region and on a peripheral region including a dummy region, and remove the photoresist from the rest of the memory cell region, prospective select gate regions in the memory cell region, and portions between adjacent prospective select gate regions. Then, as shown in FIGS. 7A and 7B, dry etching such as RIE is used to leave a portion of the SiO₂ film 108 behind as a spacer film (SiO₂ spacer film) on the side walls of the second polysilicon film 104, and remove the rest of the SiO₂ film 108.

The SiO₂ film 108 is used as a mask to remove the buried insulating film in the isolation regions 107 to a desired depth by using dry etching such as RIE. Consequently, recesses 111 are formed in at least the upper surfaces of the isolation regions 107 between the floating gates (103 and 104) in the memory cell region. After that, low-temperature hydrofluoric acid vapor processing is performed to remove the SiO₂ film 108 formed on the side walls of the second polysilicon film 104.

Subsequently, as shown in FIGS. 4A and 4B, a second gate insulating film 109 is formed on the entire surface by CVD, and a third polysilicon film 110 to which phosphorus is added as an impurity is formed on the second gate insulating film 109 by CVD. Portions of the second gate insulating film 109 on the lower gate portions of the select transistors are then removed to form holes which expose portions of the surfaces of the lower gates (103 and 104).

After that, a second silicon nitride film is deposited on the third polysilicon film 110 by CVD. A photoresist formed into a desired pattern by lithography is used as a mask to process the second silicon nitride film, third polysilicon film 110, second gate insulating film 109, second polysilicon film 104, and first polysilicon film 103, thereby forming gate electrodes and gate lines. The upper surface of the isolation region 107 in the memory cell array is intermediate between an upper surface of the floating gate (103, 104) and upper surfaces of the source and drain regions of the memory cell transistor, and a bottom surface of the recess 111 is substantially leveled with a bottom surface of the floating gate (103, 104).

Figure 9:
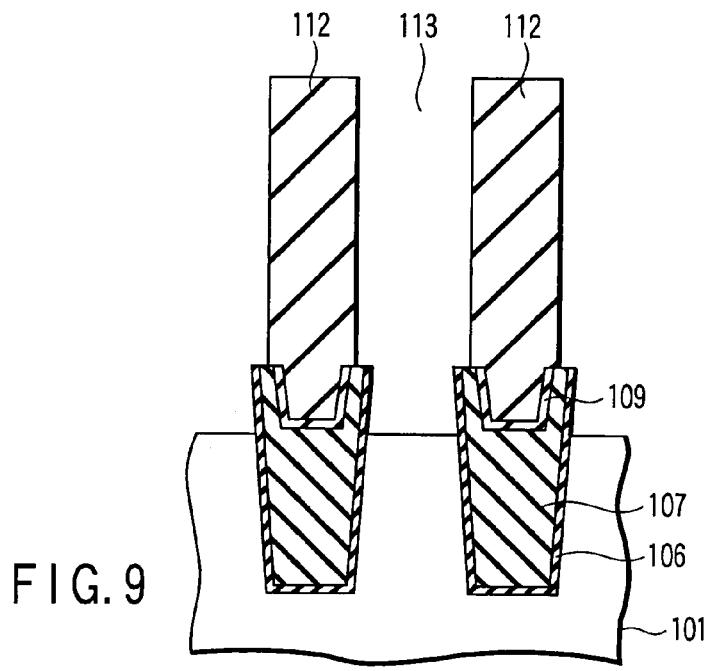
FIG. 9 is a sectional view showing a fabrication step following the step shown in FIGS. 4A and 4B.

Finally, as shown in a sectional view of FIG. 9, conventional fabrication steps are performed to form bit line contact holes and then form bit line contacts and bit lines. Note that reference numeral 112 in FIG. 9 denotes an interlayer dielectric film; and 113, a bit line contact hole.

In the NAND flash memory fabrication method described above, as shown in FIGS. 4A and 4B, after isolation regions are formed, trenches are formed by partially recessing the upper surfaces of the isolation regions 107 between the prospective control gate regions. This makes it possible to reduce the coupling capacitance between the floating gates of memory cells adjacent to each other in the word line direction, and alleviate adverse effects caused by the coupling capacitance between the floating gates of memory cells adjacent to each other in the word line direction.

A NAND flash memory of the second embodiment will be described below.

In the NAND flash memory of the first embodiment described above, the buried insulating film 107 in the isolation region recedes when the SiO₂ spacer film 108 is formed on the side walls of the second polysilicon film 104.

In this state, that portion of the buried insulating film 107, which is adjacent to the bit line contact BC formed later sometimes recedes more than necessary. If that portion of the buried insulating film 107, which is adjacent to the bit line contact BC thus recedes more than necessary, a short occurs between the semiconductor substrate 101 and the bit line contact in a portion other than the bit line contact. If this short occurs, the NAND flash memory does not normally operate any longer. In the NAND flash memory of the second embodiment, this short between the semiconductor substrate 101 and the bit line contact is prevented.

Figure 10A:
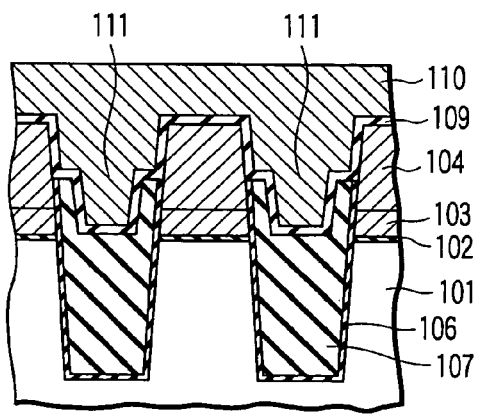
FIGS. 10A and 10B are sectional views of a NAND flash memory according to the second embodiment.
Figure 10B:
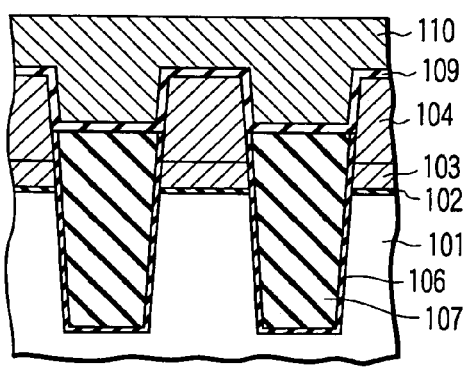

FIGS. 10A and 10B illustrate the sectional structures of the NAND flash memory of the second embodiment. FIG. 10A shows an example of the sectional structure in the control gate extending direction shown in FIG. 3. FIG. 10B shows an example of the sectional structure in the select gate extending direction shown in FIG. 3. Note that the planar pattern of a portion of a memory cell region and select transistors of the NAND flash memory according to the second embodiment is the same as the planar pattern shown in FIG. 3.

Compared to the first embodiment shown in FIGS. 4A and 4B, in the NAND flash memory shown in FIGS. 10A and 10B, the upper surfaces of isolation regions 107 in select transistor formation regions are not recessed but flat. That is, the shape of the isolation regions 107 between juxtaposed control gate lines and the shape of the isolation regions 107 between juxtaposed select gate lines are different. The rest is the same as in the first embodiment.

Similar to the NAND flash memory according to the first embodiment, however, as shown in FIG. 10A, portions of the upper surfaces of the trench-type isolation regions 107 between floating gates of memory cells are recessed. This reduces the coupling capacitance present between floating gates adjacent to each other in the longitudinal direction of a control gate 110 via the isolation region 107. As a consequence, adverse effects caused between cells by this coupling capacitance can be alleviated.

A method of fabricating the NAND flash memory having the sectional structures as shown in FIGS. 10A and 10B will be described below. In FIGS. 11A and 11B to 13A and 13B, each figure A corresponds to the section shown in FIG. 10A, and each figure B corresponds to the section shown in FIG. 10B.

Figure 14:
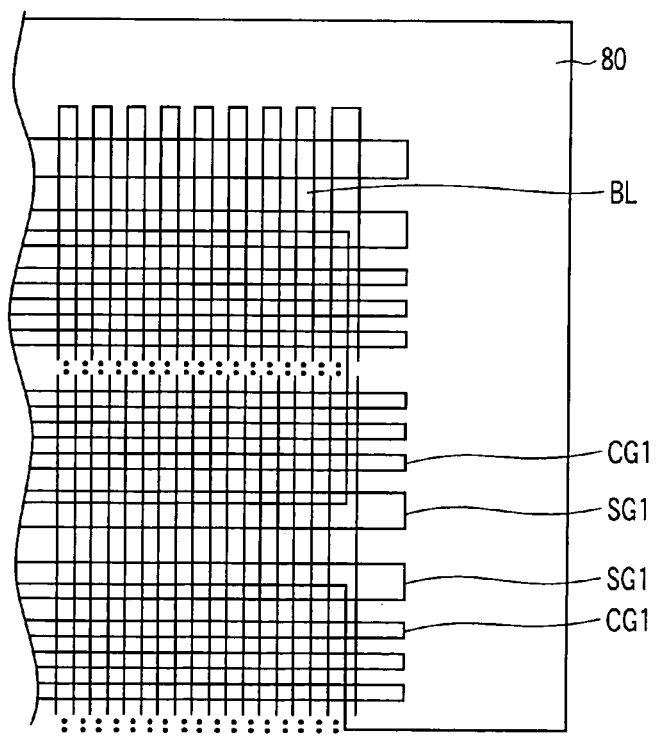
FIG. 14 is a plan view showing an example of a photoresist pattern used in the step shown in FIGS. 13A and 13B.
Figure 15:
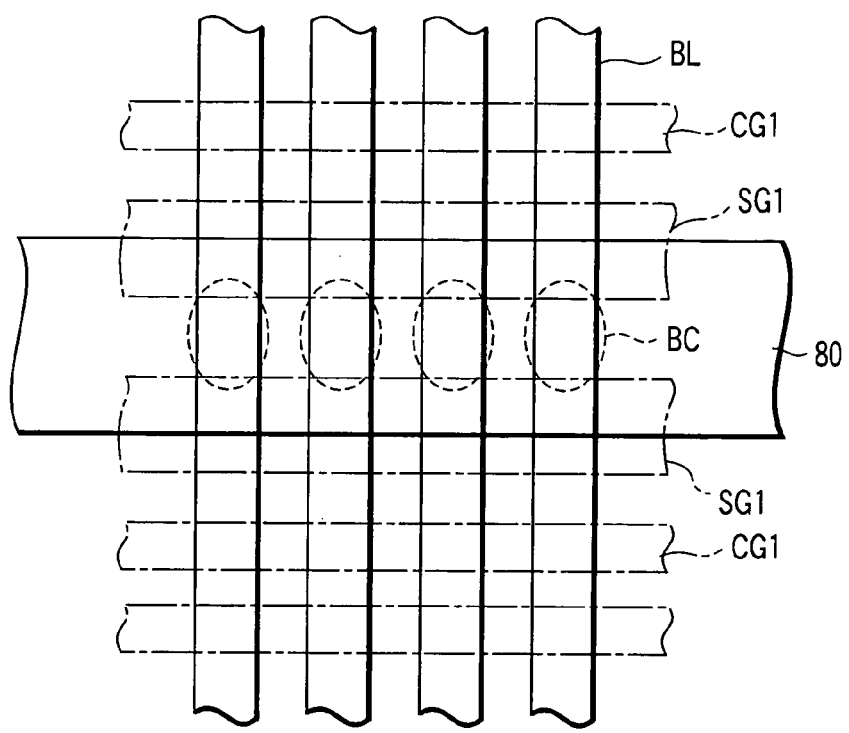
FIG. 15 is an enlarged plan view showing a portion of the photoresist pattern shown in FIG. 14.

Steps shown in FIGS. 11A and 11B and FIGS. 12A and 12B are the same as the steps explained with reference to FIGS. 5A and 5B and FIGS. 6A and 6B, respectively, in the first embodiment. After that, instead of the photoresist mask shown in FIG. 8 used in the first embodiment, a photoresist mask shown in FIGS. 14 and 15 is used to perform a step shown in FIGS. 13A and 13B. In addition, a step shown in FIGS. 10A and 10B is performed. Note that FIG. 15 is an enlarged view of the main portion of the photoresist mask shown in FIG. 14.

Figure 11A:
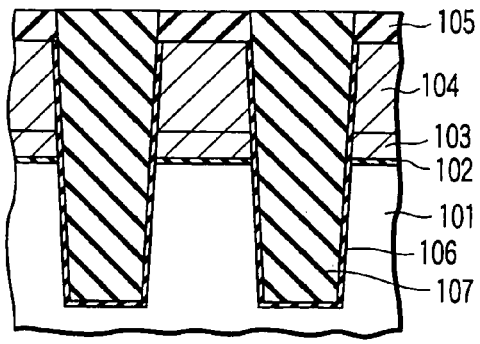
FIGS. 11A and 11B are sectional views in one fabrication step of the NAND flash memory according to the second embodiment.
Figure 11B:
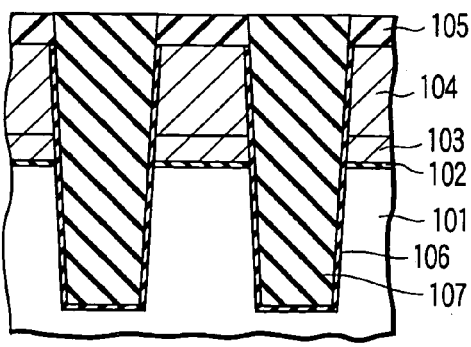

First, as shown in FIGS. 11A and 11B, a first silicon oxide film 102 is formed on a semiconductor substrate 101, and CVD is used to sequentially deposit a first polysilicon film 103, a second polysilicon film 104 to which phosphorus is added as an impurity, and a first silicon nitride film 105. Then, the obtained stacked film is formed into a desired pattern by lithography. That is, a photoresist formed into a desired pattern is used as a mask to process the first silicon nitride film 105, second polysilicon film 104, first polysilicon film 103, first silicon oxide film 102, and semiconductor substrate 101, thereby forming element regions. A second silicon oxide film 106 is then formed on the side surfaces of each element region by thermal oxidation. After that, an insulating film is deposited and planarized to the upper surface of the first silicon nitride film 105 by using CMP or the like, thereby forming isolation regions 107 made of the buried insulating film.

Figure 12A:
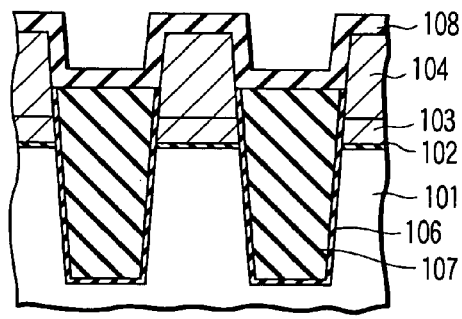
FIGS. 12A and 12B are sectional views of a fabrication step following the step shown in FIGS. 11A and 11B.
Figure 12B:
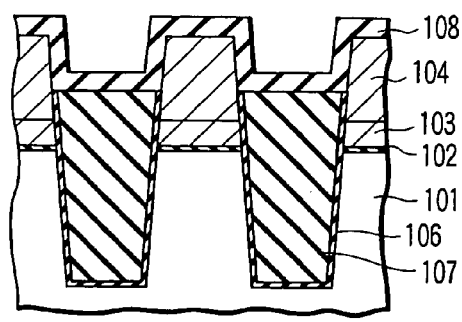

As shown in FIGS. 12A and 12B, after the first silicon nitride film 105 is removed by hot phosphoric acid, the photoresist in the memory cell region is removed by lithography. Then, wet processing using buffered-HF and dry etching such as RIE are used to remove the buried insulating film in the isolation regions 107 to a desired height. After that, an $SiO_2$ film 108 is deposited by CVD.

After a photoresist 80 is formed by coating, lithography is performed by using a mask having a pattern as shown in FIGS. 14 and 15, thereby patterning the photoresist 80 such that the photoresist 80 is left behind so as to cover regions sandwiched between adjacent prospective select gate regions in the memory cell region, portions of the prospective select gate regions, the end portions of the memory cell region, and a peripheral region including a dummy region, and the photoresist 80 is removed from the memory cell region.

Figure 13A:
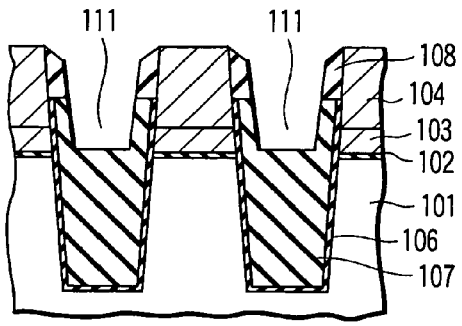
FIGS. 13A and 13B are sectional views of a fabrication step following the step shown in FIGS. 12A and 12B.
Figure 13B:
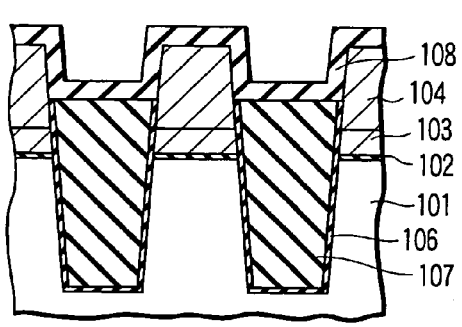

Then, as shown in FIGS. 13A and 13B, dry etching such as RIE is used to leave the $SiO_2$ film 108 behind as a spacer film on the side walls of the second polysilicon film 104. After that, the $SiO_2$ spacer film 108 on the side walls of the second polysilicon film 104 is used as a mask to remove the buried insulating film in the isolation regions 107 to a desired depth by using dry etching such as RIE. Then, low-temperature hydrofluoric acid vapor processing is performed to remove the $SiO_2$ spacer film 108.

Subsequently, as shown in FIGS. 10A and 10B, a second gate insulating film 109 is formed by CVD, and a third polysilicon film 110 is also formed by CVD. After that, a second silicon nitride film is deposited on the third polysilicon film 110 by CVD, and a photoresist formed into a desired pattern by lithography is used as a mask to process the second silicon nitride film, third polysilicon film 110, second gate insulating film 109, second polysilicon film 104, and first polysilicon film 103, thereby forming control gates and floating gates.

Figure 16:
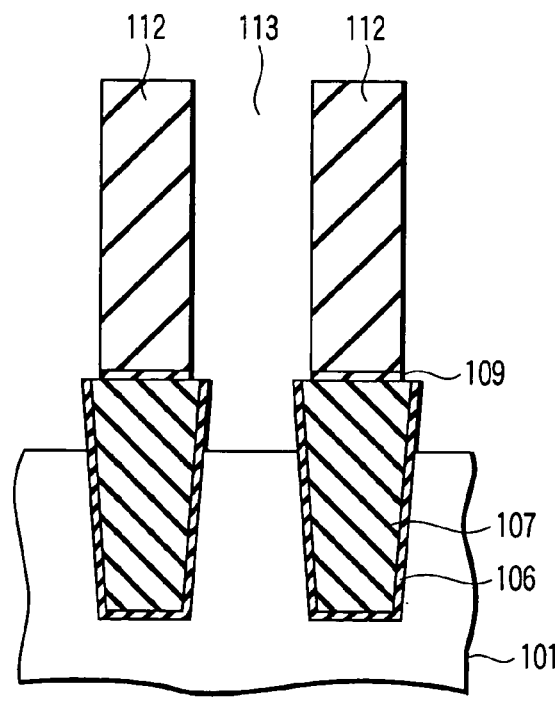
FIG. 16 is a sectional view showing a fabrication step following the step shown in FIGS. 10A and 10B.

Finally, as shown in a sectional view of FIG. 16, conventional fabrication steps are performed to form bit line contact holes and then form bit line contacts and bit lines. Note that in FIG. 16, reference numeral 112 denotes an interlayer dielectric film; and 113, a bit line contact hole.

In the NAND flash memory of the second embodiment shown in FIGS. 10A and 10B, basically the same effects as the NAND flash memory of the first embodiment are obtained. That is, since the recess 111 is formed in a portion of the upper surface of each trench-type isolation region 107 between the floating gates (103 and 104) of the memory cells, it is possible to reduce the coupling capacitance present between the floating gates (103 and 104) adjacent to each other in the control gate extending direction via the isolation region 107. Consequently, adverse effects caused between cells by this coupling capacitance can be alleviated. Also, the upper surface of each isolation region 107 between the lower gates (103 and 104) in the select transistor formation regions is not recessed. Therefore, when the bit line contacts BC are formed, no short occurs between the bit line contacts and the semiconductor substrate except in predetermined portions. This allows the NAND flash memory to normally operate.

In the NAND flash memory fabrication method of the second embodiment, as shown in FIGS. 13A and 13B, when, after isolation regions are formed, the recesses 111 are formed by partially recessing the upper surfaces of the isolation regions 107 between the prospective control gate regions, a mask is formed beforehand such that regions sandwiched between the prospective select gate regions on the semiconductor substrate 101 are covered with the photoresist 80. Accordingly, the semiconductor substrate 101 and bit line contacts BC do not short except in predetermined portions, and the NAND flash memory normally operates.

In addition, as in the fabrication method of the first embodiment described earlier, trenches are formed by partially recessing the upper surfaces of the isolation regions between the prospective control gate regions. This makes it possible to reduce the coupling capacitance between the floating gates of memory cells adjacent to each other in the word line extending direction, and alleviate adverse effects caused by the coupling capacitance between the adjacent cells.

In the first and second embodiments described above, the floating gate is made up of two conductor layers. However, the present invention is also applicable to a structure in which the floating gate is a single conductor layer. Also, in each embodiment, the photoresist in the peripheral region may also be removed at the same time the photoresist in the memory cell region is removed. Additionally, in each embodiment, the floating gate is made up of the first polysilicon film and the second polysilicon film which is formed on the first polysilicon film and to which an impurity is added. However, a polysilicon film to which an impurity is added is not limited to the second polysilicon film, so an impurity may also be added to the first polysilicon film.

In each embodiment, if the step between the upper surface of the isolation region 107 adjacent to the bit line contact BC and the active region surface is too large, the ratio (active region aspect ratio) of the bit line formation hole to the depth to the active region (common drain region) increases. This sometimes makes bit line contact formation difficult. In a case like this, the following implementation is desired.

That is, when an isolation insulating film is buried as described above and the upper surface of this isolation insulating film is recessed to form trench-type isolation regions 107, a trench-type isolation region adjacent to a bit line contact formation region is recessed to a deeper position (a position higher than the surface of an active region). This reduces the step between the upper surface of the trench-type isolation region adjacent to the bit line contact formation position and the active region surface, and facilitates bit line contact formation.

Figure 17:
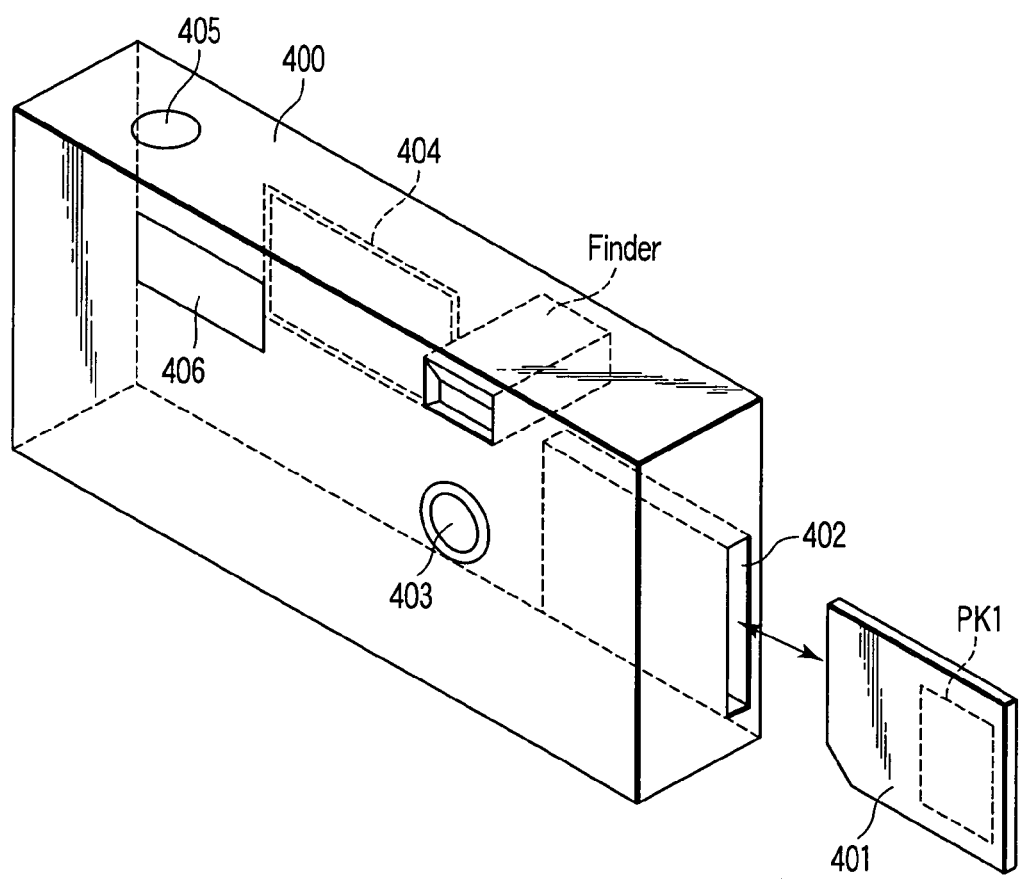
FIG. 17 is a perspective view, in which some portions are seen through, of a digital still camera according to an application using the NAND flash memory of the first or second embodiment.

Application examples of the present invention using the NAND flash memories of the embodiments of the present invention will be described below. FIG. 17 shows a digital card using the NAND flash memory described above, and an example of the arrangement of a digital apparatus using this digital card.

Referring to FIG. 17, the digital apparatus is a portable digital apparatus, e.g., a digital still camera 400. A digital card, e.g., a memory card 401 used as a recording medium of the digital still camera 400 contains an IC package PK1 in which the NAND flash memory as explained in the first or second embodiment is integrated and sealed as a memory chip.

A case of the digital still camera 400 houses a card slot 402, and a circuit board connected to the card slot 402. The memory card 401 is electrically connected to electronic circuits on the circuit board so as to be detachable from the card slot 402. When the memory card 401 is, e.g., a non-contact-type IC card, this IC card is electrically connected by radio signals to the electronic circuits on the circuit board as the card is accommodated in or moved close to the card slot 402.

In FIG. 17, reference numeral 403 denotes a lens; 404, a display such as a liquid crystal monitor; 405, an operation button such as a shutter button; and 406, a strobe.

Figure 18:
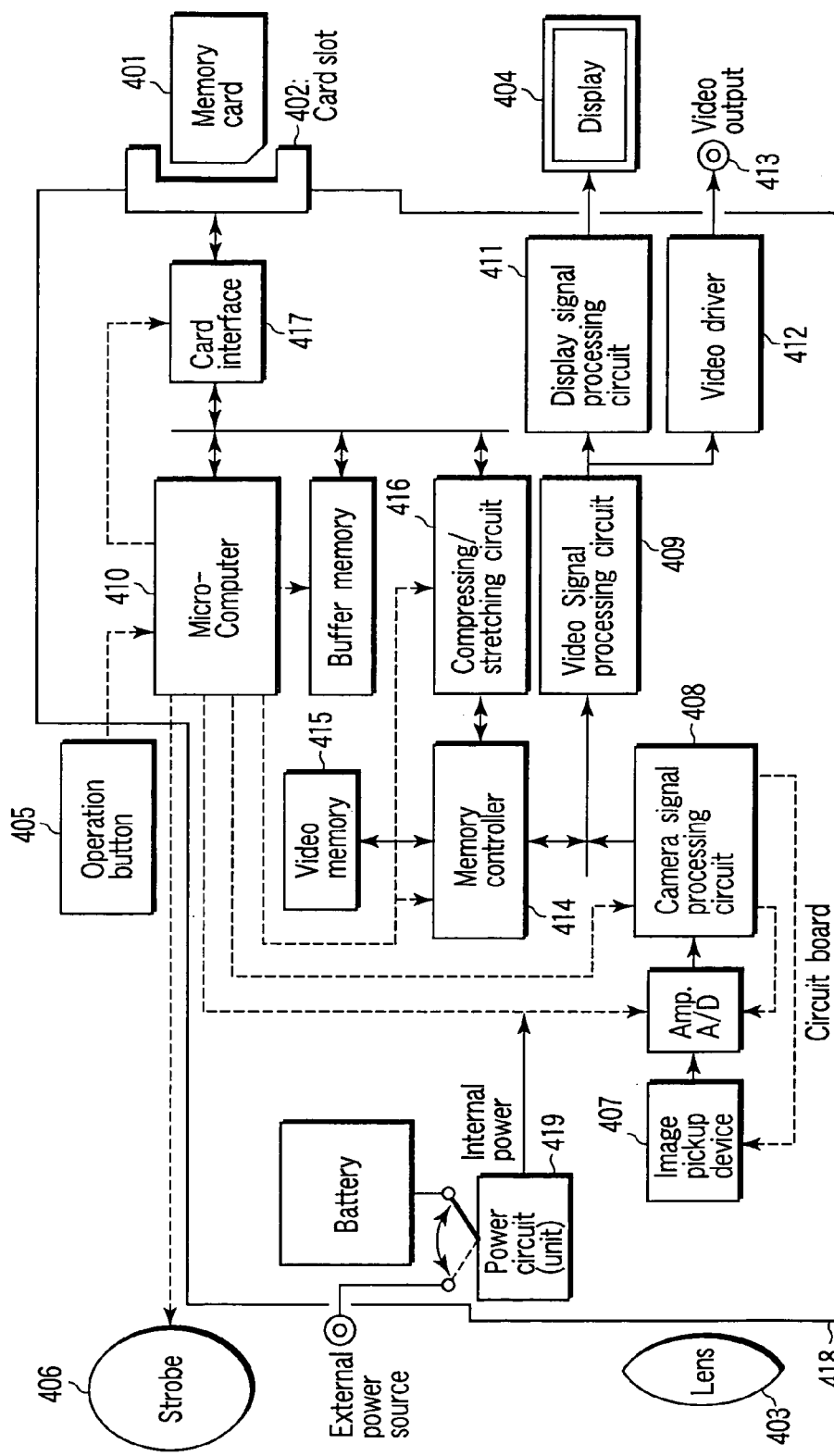
FIG. 18 is a block diagram showing the basic circuit configuration of the digital still camera shown in FIG. 17.

FIG. 18 is a block diagram showing the basic configuration of the digital still camera shown in FIG. 17. Light from an object is condensed by the lens 403 and input to, e.g., a CMOS image pickup device 407. The image pickup device 407 photoelectrically converts the input light and outputs, e.g., an analog signal. This analog signal is amplified by an analog amplifier (AMP.), and then converted into a digital signal by an analog/digital converter (A/D). The converted signal is input to a camera signal processing circuit 408 where the signal undergoes, e.g., automatic exposure control (AE), automatic white balance control (AWB), and color separation. After that, the signal is converted into a luminance signal and color-difference signal.

To monitor an image, an output signal from the camera signal processing circuit 408 is input to a video signal processing circuit 409, and converted into a video signal. An example of the system of the video signal is NTSC (National Television System Committee). The image pickup device 407, AMP., A/D, and camera signal processing circuit 408 described above are controlled by a microcomputer 410.

The video signal is output to the display 404 mounted on the digital still camera 400 via a display signal processing circuit 411. This video signal is also supplied to a video output terminal 413 via a video driver 412.

An image thus sensed by the digital still camera 400 can be output as video output from the video output terminal 413 to an image apparatus such as a television monitor. In this way, the sensed image can be displayed on other apparatuses than the display 404.

To capture an image, an operator presses the operation button 405. Consequently, the microcomputer 410 controls a memory controller 414 to write an output signal from the camera signal processing circuit 408 into a video memory 415 as a frame image. The thus written frame image is compressed on the basis of a predetermined compression format by a compressing/stretching circuit 416, and recorded in the memory card 401 inserted into the card slot 402 via a card interface 417.

To play back a recorded image, an image recorded in the memory card 401 is read out via the card interface 417, stretched by the compressing/stretching circuit 416, and written in the video memory 415. The written image is input to the vide signal processing circuit 409, and displayed on the display 404 or another image apparatus in the same manner as when an image is monitored.

In the above configuration, the card slot 402, image pickup device 407, AMP., A/D, camera signal processing circuit 408, video signal processing circuit 409, display signal processing circuit 411, video driver 412, microcomputer 410, memory controller 414, video memory 415, compressing/stretching circuit 416, and card interface 417 are mounted on the circuit board 418. However, the card slot 402 need not be mounted on the circuit board 418, and may also be connected to the circuit board 418 by a connector cable or the like.

In addition, a power circuit 419 such as a DC/DC converter is mounted on the circuit board 418. The power circuit 419 receives the supply of power from an external power source or battery, and generates an internal power supply voltage to be used inside the digital still camera 400. This internal power supply voltage is supplied to the individual circuits described above, and also supplied to the strobe 406 and display 404.

Figure 19:
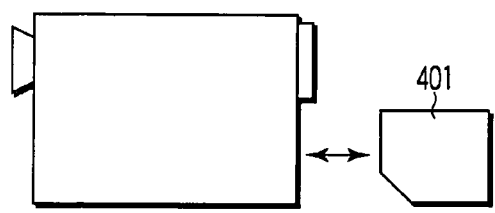
FIG. 19 is a front view schematically showing the arrangement of a video camera using a digital card shown in FIG. 17.
Figure 24:
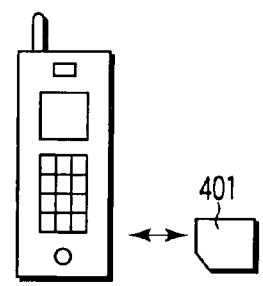
FIG. 24 is a front view schematically showing the arrangement of a cell phone using the digital card shown in FIG. 17.
Figure 20:
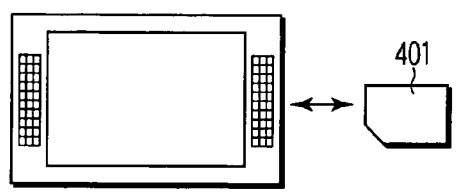
FIG. 20 is a front view schematically showing the arrangement of a television monitor using the digital card shown in FIG. 17.
Figure 25:
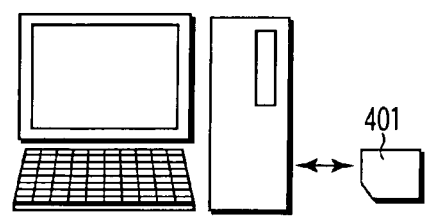
FIG. 25 is a front view schematically showing the arrangement of a personal computer using the digital card shown in FIG. 17.
Figure 21:
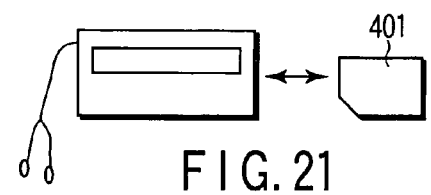
FIG. 21 is a front view schematically showing the arrangement of an audio apparatus using the digital card shown in FIG. 17.
Figure 26:
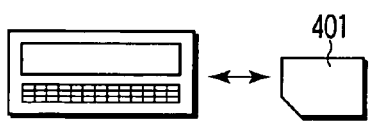
FIG. 26 is a front view schematically showing the arrangement of a personal digital assistant using the digital card shown in FIG. 17.
Figure 22:
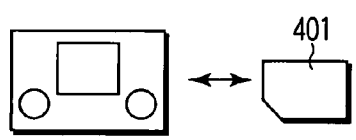
FIG. 22 is a front view schematically showing the arrangement of a game apparatus using the digital card shown in FIG. 17.
Figure 27:
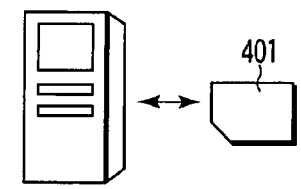
FIG. 27 is a front view schematically showing the arrangement of a voice recorder using the digital card shown in FIG. 17.
Figure 23:
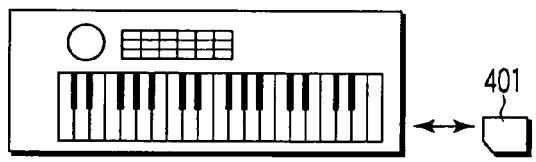
FIG. 23 is a front view schematically showing the arrangement of an electronic musical instrument using the digital card shown in FIG. 17.
Figure 28:
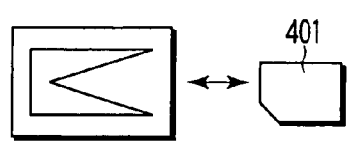
FIG. 28 is a front view schematically showing the arrangement of a PC card using the digital card shown in FIG. 17.

The digital card of this application example is applicable not only to a portable digital apparatus such as the above-mentioned digital still camera, but also to various apparatuses schematically illustrated in FIGS. 19 to 28. That is, FIG. 19 shows a video camera, FIG. 20 shows a television set, FIG. 21 shows an audio apparatus, FIG. 22 shows a game apparatus, FIG. 23 shows an electronic musical instrument, FIG. 24 shows a cell phone, FIG. 25 shows a personal computer, FIG. 26 shows a personal digital assistant (PDA), FIG. 27 shows a voice recorder, and FIG. 28 shows a PC card such as a PC card memory having the form of PCMCIA standards.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A nonvolatile semiconductor memory device comprising:
   a memory cell array region including a plurality of NAND cells arranged in a matrix manner, each NANID cell having a plurality of memory cell transistors each of which has a stacked gate structure in which a floating gate and control gate are stacked on a semiconductor substrate, a source region, a drain region, and a channel region, and which are arranged in series to share the source and drain regions;
   a plurality of select transistors formed on the semiconductor substrate, said plurality of select transistors being arranged one at each of two ends of each NAND cell, having a source region, drain region, and channel region, and forming a NAND column together with the NAND cell by sharing the source region or drain region between two memory cell transistors at the two ends of the NAND cell;
   a first trench-type isolation region formed between columns in an array of the NAND columns, formed in self-alignment with end portions of the channel region and floating gate of the memory cell transistor, and having a recess formed in an upper surface between the floating gates of the memory cell transistors;
   a second trench-type isolation region having a flat upper surface and formed in self-alignment with an end portion of the channel region of the select transistor between columns in an array of the NAND) columns;
   a plurality of control gate lines each connected to the control gates of the memory cell transistors in the same row of the memory cell array region, and running in a row direction;
   a plurality of select gate lines connected to gates of the select transistors in the same row, and running in the row direction;
   a bit line connected, via a bit line contact, to the drain regions of the select transistors at opposing ends of two NAND columns adjacent to each other in a column direction in the array of the NAN) columns; and
   a source line connected to the source regions of the select transistors at the other ends of the two NAND columns adjacent to each other in the column direction in the array of the NAND columns.

2. A device according to claim 1, wherein the recess is formed in the form of a band in the column direction in a central portion of the upper surface of the isolation region.

3. A device according to claim 1, wherein the upper surface of the first trench-type isolation region in the memory cell array region is intermediate between an upper surface of the floating gate and upper surfaces of the source and drain regions of the memory cell transistor, and a bottom surface of the recess is substantially leveled with a bottom surface of the floating gate.

4. A device according to claim 1, wherein each select transistor has an upper gate made of the same conductor layer as the control gate, and a lower gate made of the same conductor layer as the floating gate, and the upper gate is connected to the select gate line.

5. A device according to claim 4, wherein the upper surface of the second trench-type isolation region is intermediate between an upper surface of the lower gate and upper surfaces of the source and drain regions of the select transistor.

6. A device according to claim 5, wherein a bottom portion of the control gate line is present, via an inter-gate insulating film, on the first trench-type isolation region between the floating gates in the memory cell array region, and a bottom portion of the select gate line is present, via the inter-gate insulating film, on the second trench-type isolation region between the lower gates in the select transistor formation region.

7. A device according to claim 5, wherein the bit line contact is positioned between two select gate lines connected to the select transistors at opposing ends of two NAND cells adjacent to each other in the column direction in the array of the NAND columns, and the bit line is formed in the column direction above the isolation region between columns in the array of the NAND columns.

8. A method of fabricating a nonvolatile semiconductor memory device which comprises:
   a memory cell array region including a plurality of NAND cells arranged in a matrix manner, each NAND cell having a plurality of memory cell transistors each of which has a stacked gate structure in which a floating gate and control gate are stacked on a semiconductor substrate, a source region, a drain region, and a channel region, and which are arranged in series to share the source and drain regions;
   a plurality of select transistors formed on the semiconductor substrate, said plurality of select transistors being arranged one at each of two ends of each NAND cell, having a source region, drain region, and channel region, and forming a NAND column together with the NAND cell by sharing the source region or drain region between two memory cell transistors at the two ends of the NAND cell;
   a trench-type isolation region formed between columns in an array of the NAND columns, formed in self-alignment with end portions of the channel region and floating gate of the memory cell transistor, formed in self-alignment with an end portion of the channel region of the select transistor, and having a recess formed in at least an upper surface between the floating gates of the memory cell transistors;
   a plurality of control gate lines each connected to the control gates of the memory cell transistors in the same row of the memory cell array region, and running in a row direction;

a plurality of select gate lines connected to gates of the select transistors in the same row, and running in the row direction;

a bit line connected, via a bit line contact, to the drain regions of the select transistors at opposing ends of two NAND columns adjacent to each other in a column direction in the array of the NAND columns; and a source line connected to the source regions of the select transistors at the other ends of the two NAND columns adjacent to each other in the column direction in the array of the NAND columns, comprising:

forming the isolation region in the memory cell array region and a select transistor formation region; and forming the recess in the upper surface of the isolation region between the floating gates in the memory cell array region;

wherein the recess is formed while the isolation region in the select transistor formation region is masked.

9. A method of fabricating a nonvolatile semiconductor memory device which comprises:

a memory cell array region including a plurality of NAND cells arranged in a matrix manner, each NAND cell having a plurality of memory cell transistors each of which has a stacked gate structure in which a floating gate and control gate are stacked on a semiconductor substrate, a source region, a drain region, and a channel region, and which are arranged in series to share the source region and drain region; and a plurality of select transistors formed on the semiconductor substrate, said plurality of select transistors being arranged one at each of two ends of each NAND cell, having a source region, drain region, and channel region, having a lower gate which is the same layer as the floating gate and an upper gate which is the same layer as the control gate, and sharing the source region or drain region between two memory cell transistors at the two ends of the NAND cell, comprising:

forming a first insulating film on the semiconductor substrate;

forming at least one first electrode layer for forming the floating gate and lower gate on the first insulating film;

selectively removing the first electrode layer, first insulating film, and semiconductor substrate to form a trench for the isolation region in self-alignment with the first electrode layer;

burying an isolation insulating film in the trench, and etching the isolation insulating film until an upper surface of the isolation insulating film is intermediate between the first electrode layer and the first insulating film;

forming a recess in the upper surface of the isolation region between the first electrode layers in the memory cell array region;

forming a second insulating film on an entire surface;

removing a portion of the second insulating film on the lower gate portion of the select transistor to form an opening which partially exposes a surface of the lower gate portion;

depositing a second electrode layer on an entire surface; and forming a gate processing pattern on the second electrode layer, and patterning the second electrode layer, second insulating film, and first electrode layer by using the gate processing pattern as a mask, thereby forming the control gate and upper gate made of the second electrode layer, and the floating gate and lower gate made of the first electrode layer;

wherein the recess is formed while the isolation region in a select transistor formation region is masked.

10. A method according to claim 9, wherein the recess is formed by:

depositing a third insulating film on an entire surface, and forming a spacer film by leaving the third insulating film behind on side walls of the first electrode layer of the memory cell transistor;

etching away a portion of the upper surface of the isolation region by using the spacer film as an etching mask; and removing the spacer film.

11. A nonvolatile semiconductor memory device including memory cells and select transistors, comprising:

a semiconductor substrate including a plurality of isolation regions formed on the semiconductor substrate along to a first direction and a plurality of element regions isolated by the isolation regions;

first gate insulating films formed on the element regions, respectively;

floating gates of the memory cells, formed on the first gate insulating films, respectively;

lower gates of the select transistors formed on the first gate insulating films, each lower gate located adjacent to one of the floating gates in a second direction crossing to the first direction, respectively;

first buried insulating films formed on the isolation regions, each first buried insulating films located adjacent to the floating gates in the second direction, respectively;

second buried insulating films formed on the isolation regions, each second buried insulating film located adjacent to the lower gates in the second direction, respectively;

control gates of the memory cells, each control gate formed above the floating gates and the first buried insulating films along to the second direction via an inter-gate insulating film, respectively;

upper gates of the select transistors, each upper gate formed above the lower gates and the second buried insulating films along to the second direction, respectively, wherein each first buried insulating film includes a first upper surface having a recess, a height of the first upper surface is higher than a surface of the semiconductor substrate, each control gate is located in the recess, a bottom side portion of each of the floating gates faces to the control gate located in the recess via the first buried insulating film in the second direction, each second buried insulating film including a second upper surface, a height of the second upper surface is higher than the surface of the semiconductor substrate, and a bottom side portion of each of the lower gates faces to the second buried insulating film without the upper gate in the second direction.

12. A device according to claim 11, wherein the recess is a groove formed in a center portion of the first upper surface along to the first direction.

13. A device according to claim 11, wherein the recess includes a first bottom surface which is substantially leveled with a second bottom surface of the floating gate.

14. A device according to claim 11, wherein the upper gates are made of the same conductor film as the control gate, and the lower gates are made of the same conductor film as the floating gate.

15. A device according to claim 11 further comprising a second inter-gate insulating film located between each of the upper gates and each of the lower gates.

16. A device according to claim 11 further comprising a NAND cell including a plurality of the floating gates connected in series such that adjacent the floating gates via a source and a drain formed in the element region of the semiconductor substrate wherein each of the lower gate are located an end of the NAND cell in the first direction.

17. A device according to claim 11, wherein the first and the second directions are perpendicular to each other.

18. A device according to claim 11, wherein the height of the second upper surface is lower than the height of the first upper surface.

19. A device according to claim 11, wherein the second upper surface is substantially flat over the whole.

* * * * *